(12) United States Patent
Hosomomi

(10) Patent No.: US 10,204,801 B2
(45) Date of Patent: Feb. 12, 2019

(54) METHOD FOR PRODUCING SUBSTRATE FOR SEMICONDUCTOR ELEMENT MOUNTING

(71) Applicant: OHKUCHI MATERIALS CO. LTD., Kagoshima (JP)

(72) Inventor: Shigeru Hosomomi, Isa (JP)

(73) Assignee: OHKUCHI MATERIALS CO., LTD., Kagoshima (JP)

( * ) Notice: Subject to any disclaimer, the term of this patent is extended or adjusted under 35 U.S.C. 154(b) by 0 days.

(21) Appl. No.: 14/777,834

(22) PCT Filed: Mar. 11, 2014

(86) PCT No.: PCT/JP2014/056304
§ 371 (c)(1),
(2) Date: Sep. 17, 2015

(87) PCT Pub. No.: WO2014/148308
PCT Pub. Date: Sep. 25, 2014

(65) Prior Publication Data
US 2016/0300732 A1 Oct. 13, 2016

(30) Foreign Application Priority Data

Mar. 19, 2013 (JP) ................................. 2013-056466

(51) Int. Cl.
| | | |
|---|---|---|
| H01L 21/428 | (2006.01) | |
| H01L 21/48 | (2006.01) | |
| H01L 23/498 | (2006.01) | |
| G03F 7/20 | (2006.01) | |
| G03F 7/32 | (2006.01) | |
| H01L 21/56 | (2006.01) | |
| H01L 23/495 | (2006.01) | |

(52) U.S. Cl.
CPC ........ *H01L 21/4832* (2013.01); *G03F 7/2022* (2013.01); *G03F 7/32* (2013.01); *H01L 21/4821* (2013.01); *H01L 21/4825* (2013.01); *H01L 21/4846* (2013.01); *H01L 21/565* (2013.01); *H01L 23/49548* (2013.01); *H01L 23/49894* (2013.01); *H01L 23/49866* (2013.01); *H01L 2924/0002* (2013.01)

(58) Field of Classification Search
CPC ... G03F 7/2024; G03F 7/2022; G03F 7/70466
USPC ........................................................ 430/394
See application file for complete search history.

(56) References Cited

U.S. PATENT DOCUMENTS

| | | | |
|---|---|---|---|
| 6,037,245 A | 3/2000 | Matsuda | |
| 2007/0298603 A1 | 12/2007 | Rebibis et al. | |
| 2013/0026639 A1* | 1/2013 | Arnold | H01L 21/0274 257/773 |

FOREIGN PATENT DOCUMENTS

| | | |
|---|---|---|
| JP | 06-005631 A | 1/1994 |
| JP | 2000022131 A | 1/2000 |
| JP | 2002009196 A | 1/2002 |
| JP | 2007103450 A | 4/2007 |
| WO | 2014/148308 A1 | 9/2014 |

OTHER PUBLICATIONS

International Search Report dated Apr. 28, 2014 which issued during the prosecution of International Application No. PCT/JP2014/056304.

\* cited by examiner

*Primary Examiner* — Daborah Chacko-Davis
(74) *Attorney, Agent, or Firm* — Troutman Sanders LLP

(57) ABSTRACT

A process of forming, on a surface of the substrate a plurality of resist layers made of two kinds of dry film resist that differ in main peak wavelength in spectral photosensitivity. An exposure process of selectively exposing and affecting a particular resist layer in accordance with a first pattern upon using a first exposure mask overlaid on the plurality of resist layers. A second exposure process of exposing another resist layer in accordance with a second pattern upon using a second exposure mask overlaid on the plurality of resist layers. Partially uncovering the surface of the substrate by removing unexposed portions of the plurality of resist layers, to form a resist mask having an aperture. Finally, forming a coat layer by plating a portion of the substrate where the surface thereof is uncovered; and a process of removing the resist mask.

5 Claims, 4 Drawing Sheets

METHOD FOR PRODUCING SUBSTRATE FOR SEMICONDUCTOR ELEMENT MOUNTING

CROSS REFERENCE TO RELATED APPLICATIONS

This application is the U.S. National Phase of International Patent Application Serial No. PCT/JP2014/056304, filed Mar. 11, 2014, which claims priority to Japanese Application Serial No. 2013-056466, filed Mar. 19, 2013. The international Application was published on Sep. 25, 2014, as International Publication No. WO 2014/143808 under PCT Article 21(2). The entire contents of these Applications are hereby incorporated herein by reference

TECHNICAL FIELD

The present invention relates to a method for producing a substrate for semiconductor element mount which is provided, on a surface of an electroconductive substrate such as a metal plate, with a coat layer by plating, of which terminals are made.

BACKGROUND ART

There have been known semiconductor devices manufactured by: producing a substrate for semiconductor element mount by forming a resist mask carrying a particular pattern on one side of base material having electroconductivity, plating the base material, where uncovered with the resist mask, with electroconductive metal, to form a metal layer for mounting a semiconductor element thereon and an electrode layer for connection with externals, and removing the resist mask; mounting a semiconductor element on the metal layer region of the substrate for semiconductor element mount; wire-bonding and then resin-sealing the semiconductor element and the electrode layer; and removing the base material, so that the metal layer and the electrode layer are left uncovered on the resin side.

Such semiconductor devices used to be conventionally made of metal base material of 0.1-0.25 mm thickness called leadframe. However, in place of the conventional metal base material, use of a metal layer and an electrode layer of 0.01-0.08 mm thickness formed by plating facilitates thinner design of products. In this case, while the base material used in the processes of production is removed, it is important that the metal layer and the electrode layer formed by plating should be firmly adhered to the sealing resin and remain, unremoved, on the resin side.

Patent Document 1 states that a substrate for semiconductor element mount having a hangover portion beyond the upper side rim of a metal layer and an electrode layer is obtained by electrodeposition (plating) of electroconductive metal over the formed resist mask, so that the metal layer and the electrode layer firmly remain on the resin side with the hangover portion biting into the resin in resin-sealing.

Patent Document 2 states forming of a metal layer or an electrode layer having a trapezoidal sectional shape with the top base longer than the bottombase, by shaping a resist mask trapezoidal using scattered ultraviolet light.

PRIOR ART DOCUMENTS

Patent Documents

Patent Document 1: TOKUKAI 2002-9196
Patent Document 2: TOKUKAI 2007-103450

SUMMARY OF THE INVENTION

Problem to be Solved by the Invention

According to the method of electrodepositing electroconductive metal over a resist mask as shown in Patent Document 1, a metal layer and an electrode layer are formed by plating as overhanging the resist mask. The amount of overhang of the metal layer and the electrode layer is proportional to the coat thickness beyond the resist mask. However, depending on morphology of the resist mask pattern and conditions of plating, a large unevenness may be produced in coat thickness, and accordingly, in hangover length of the metal layer and the electrode layer, also. Therefore, when the size and the interval of the metal layer and the electrode layer of a substrate for semiconductor mount are designed, this unevenness of the hangover length should be taken into consideration, and thus it is difficult to make the size and the interval of the metal layer and the electrode layer small.

The method of forming the sectional shape of the aperture in the resist mask as a trapezoid with the top base longer than the bottom base using scattered ultraviolet light, as shown in Patent Document 2, is an effective method as far as the thickness of a resist layer to be used is up to 25 µm or so. Therefore, the method shown in Patent Document 2 can be said as an effective method as far as the metal layer or the electrode layer to be formed is up to 20 µm or so.

However, in a case where the resist layer is thickened to be about 50 µm, for example, the angles at the bottom base edges of the trapezoidal section of the aperture approach 90 degrees (i.e. a rectangle) or much smaller, where the sectional shape comes to be a trapezoid with the metal-plate side being the longer base, because ultraviolet light attenuates as being absorbed by the resist while travelling toward the metal plate. As a result, the metal layer or the electrode layer formed inside the aperture by plating fails to have a shape of a trapezoid with a longer top base, and thus adhesion of the metal layer or the electrode layer to the resin is declined.

For an enhanced adhesion of the metal layer and the electrode layer to the resin, an increased thickness of the metal layer and the electrode layer works. Alternatively, for making the metal layer and the electrode layer bite into the resin, there works a section of the metal layer and the electrode layer shaped as a trapezoid with a longer top base or having an uneven contour, or a section of the metal layer and the electrode layer shaped as a trapezoid with a longer top base as well as having an uneven contour.

Therefore, it is preferable that the metal layer and the electrode layer are made thick by means of a thickened resist layer. Also, much preferable is to form a resist mask designed for a coat layer to be formed by plating with a section shaped as a trapezoid with a longer top base or shaped to have an uneven contour, and then to form, using this resist mask, such a coat layer. While dependent on morphology of the trapezoid or the contour unevenness, it is necessary, in general, to produce a substrate for semiconductor element mount in such a manner that the thickness of the metal layer and the electrode layer formed from the coat layer by plating are approximately 30-104 µm.

The method for producing substrate for semiconductor element mount according to the present invention is made for the purpose of solving the problem set forth above. According to one embodiment mode of the present invention, by forming a metal layer and an electrode layer thick and to have an uneven sectional shape, it is possible to provide a substrate for semiconductor element mount with much enhanced adhesion of the metal layer or the electrode layer to the resin.

Measures to Solve the Problem

In order to attain the above-mentioned object, the method according to one embodiment mode of the present invention for producing a substrate for semiconductor element mount provided, on an electroconductive substrate, with a coat layer by plating, which is to be formed into terminals, is characterized by sequentially passing through: a process of forming, on a surface of the substrate, a plurality of resist layers made of first dry film resist and second dry film resist that are different in main peak wavelength in spectral photosensitivity; a first exposure process of selectively exposing and affecting, out of the plurality of resist layers, at least one resist layer made of the first dry film resist in accordance with a first pattern upon using a first exposure mask overlaid on the plurality of resist layers; a second exposure process of exposing and affecting, out of the plurality of resist layers, at least one resist layer made of the second dry film resist in accordance with a second pattern upon using a second exposure mask overlaid on the plurality of resist layers; a development process of partially uncovering the surface of the substrate by removing unexposed portions of the plurality of resist layers, to form a resist mask having an aperture; a process of forming a coat layer by plating a portion of the substrate where the surface thereof is uncovered; and a process of removing the resist mask.

According to one embodiment mode of the present invention, it is preferable that the first exposure mask and the second exposure mask are different in pattern they carry. Exposure and development of the plurality of resist layers made of two kinds of dry film resist using the first and second exposure masks produces a resist mask for plating, through which the surface of the substrate appears as uncovered; it is preferable that a section of the aperture in the resist mask is shaped to be given unevenness by the difference in pattern between the first exposure mask and the second exposure mask.

According to one embodiment mode of the present invention, it is preferable, in exposure, that the first exposure process or the second exposure process is conducted upon selection of ultraviolet light with a predetermined wavelength through a band pass filter.

According to one embodiment mode of the present invention, it is preferable, in exposure, that the first exposure process or the second exposure process is conducted by use of ultraviolet light having wavelengths that can affect a selected resist layer alone.

Effect of the Invention

By applying, to each other, two or three layers of two kinds of dry film resist different in main peak wavelength in spectral photosensitivity on an electroconductive material, as a material of the semiconductor substrate, conducting, for each layer, a patterning by exposure of only a target layer in the multi-layered dry film resist by exposing, via an exposure mask, the dry film resist with single-line ultraviolet light to which the target resist layer is sensitive, and developing the dry film resist, it is possible to produce an aperture having a section shaped as a trapezoid with a longer top base, a section shaped into a letter T, or a section whose contour has concavities or convexities. Then, by multi-layering a coat by electrodeposition, the metal used for plating can be formed into the same shape as the aperture of the dry film resist, which acts as a mold. Therefore, the metal layer or the electrode layer can be formed to have an uneven sectional shape. As a result, since the section of the metal layer or the electrode layer is shaped to be uneven, it is possible to provide a substrate for semiconductor element mount with enhanced adhesion of the metal layer or the electrode layer to the resin.

BRIEF DESCRIPTION OF THE DRAWINGS

FIG. 2.

FIG. 3.

FIG. 4.

MODE FOR CARRYING OUT THE INVENTION

First, on a surface of a base material having electroconductivity, two or three of resist layers are formed of two kinds of dry film resist that are different in peak wavelength in spectral photosensitivity. Since configuring the resist layers to have four or more layers is possible but costly, it is preferable that the resist layers are formed of two or three layers.

Next, first exposure is conducted with ultraviolet light to which a target resist layer is sensitive using a first exposure mask, second exposure is conducted with ultraviolet light to which another resist layer is sensitive using a second exposure mask, and then development is conducted, to form the plurality of resist layers into a resist mask by providing them with an aperture. Here, the exposure masks are shaped to make the plurality of resist layers produce uneven contour of the section of the aperture. The resist mask with the aperture is used as a mask for plating.

The substrate surface is uncovered where the aperture is formed, and is plated, under an appropriate electroplating process, with a coat layer whose section has an uneven contour. Then, by detachment of the resist mask, a substrate for semiconductor element mount can be obtained.

Figure 1A:
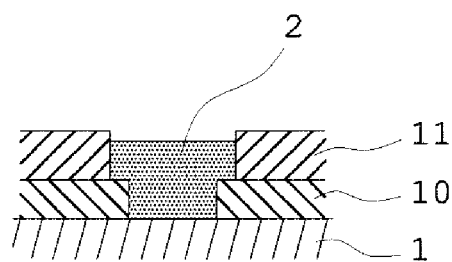
FIG. 1A is a sectional view that shows the situation where, upon forming of a resist mask having two layers by use of two kinds of dry film resist different in main peak wavelength in spectral photosensitivity on an electroconductive substrate, desired plating is made according to the production method of one embodiment mode of the present invention; and each of FIGS. 1B and 1C is a sectional view that shows the situation where, upon forming of a resist mask having three layers made of two kinds of dry film resist different in main peak wavelength in spectral photosensitivity on an electroconductive substrate, desired plating is made according to the production method of one embodiment mode of the present invention.
Figure 1B:
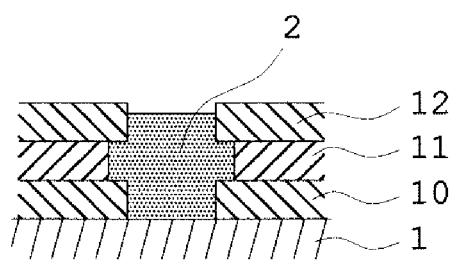
FIG. 1.
Figure 1C:
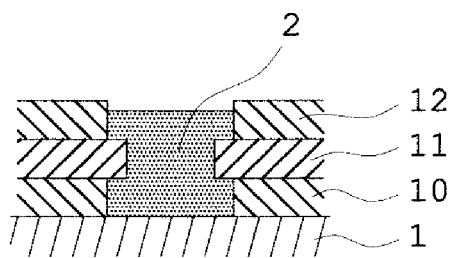

To be more specific, as shown in FIG. 1, for example, by applying, to each other, two or three layers of two kinds of dry film resist different in main peak wavelength in spectral photosensitivity (e.g. dry film resist (DFR) for direct imaging (DI) (main peak wavelength: h line) and general purpose DFR (main peak wavelength: i line)) on an electroconductive material, as a material of the semiconductor substrate, then conducting, for each layer, a patterning by exposure of only a target layer in the multi-layered dry film resist by exposing, via an exposure mask, the dry film resist with single-line ultraviolet light to which the target resist layer is sensitive (e.g. h line only, i line only), and then by developing the resist layers, a resist mask composed of two or three layers 10, 11 and 12 is formed with an aperture having a section shaped into a letter T (FIG. 1A) or a section whose contour has concavities or convexities (FIGS. 1B, 1C). After that, coating metal is formed into a coat layer 2 having the same shape as the aperture of the resist mask 10, 11, 12 by multi-layering of a coat by electrodeposition, using the aperture as a mold.

EMBODIMENT EXAMPLES

Example 1

Here, in reference to FIG. 2, an explanation is made of an experiment conducted by the present inventor as one embodiment example of the production method of the substrate for semiconductor element mount of the present invention. As shown in FIG. 2A, on both surfaces of SUS430 of 0.15 mm thickness as an electroconductive substrate 1, dry film resist (Asahi Kasei E-Materials: ADH-252) of 25 μm thickness was laminated, to form a resist layer 10 (the back-surface side not shown). The lamination conditions on that occasion were: roll temperature 105° C.; roll pressure 0.5 MPa; and feeding speed 2.5 m/min. The laminated dry film resist is a negative type resist, and can be exposed and affected by h-line irradiation (peak wavelength in spectral photosensitivity: 405 nm).

Then, overlaid on the resist layer 10 on one side (front-surface side), dry film resist different from the resist layer 10 in main peak wavelength in spectral photosensitivity (Asahi Kasei E-Materials: AQ-5038) of 50 μm thickness was laminated under the same lamination conditions as above, to form an upper resist layer 11. This dry film resist also is a negative-type resist, and can be exposed and affected by i-line irradiation (peak wavelength in spectral photosensitivity: 365 nm).

Figure 2A:
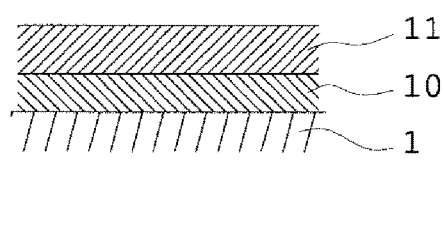
FIGS. 2A-2E show, in the form of sectional views, what is done in individual processes along the production flow of the production method in a case where the resist layers are composed of two layers as in the first embodiment example.

In this way, on the front-surface side of the substrate 1, the resist layers 10, 11 were formed of the two kinds of dry film resist different in main peak wavelength in spectral photosensitivity as shown in FIG. 2A, while on the back-surface side (not shown) was formed a resist layer same as the lower resist layer on the front-surface side.

Figure 2D:
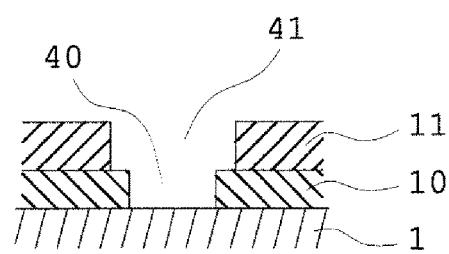
Figure 2B:
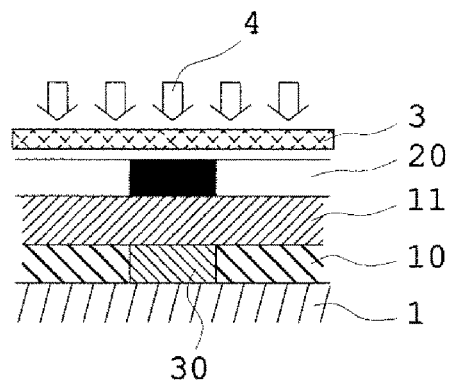

Then, as shown in FIG. 2B, a mask 20 for exposure carrying a particular pattern was overlaid on the front-surface side resist layers 10 and 11, and a bandpass filter 3 for 405 nm was set between the mask 20 and a light source 4 for exposure.

Then, an exposure was conducted using, as the light source 4, a mercury lamp (Oak Manufacturing: short arc lamp) providing mixed lines in which i-line is the main peak wavelength and h line and g line are contained, to make ultraviolet light of 405 nm wavelength affect and harden the lower resist layer 10 on the front-surface side in accordance with the pattern carried by the mask 20, while the same light source directly affected and hardened the resist layer 10 on the back-surface side over the entire surface (back-surface side not shown). On that occasion, the exposure dose was 18 mJ/cm² on the front-surface side as measured by a detector for 405 nm wavelength and was 80 mJ/cm² on the back-surface side as measured by a detector for 365 nm wavelength.

This means that an h-line exposure was conducted through the bandpass filter 3 for 405 nm wavelength on the front-surface side, leaving the resist layer 11 intact, while a mixed-line exposure on the back-surface side altered the resist layer into a resist mask hardened over the entire surface.

Figure 2E:
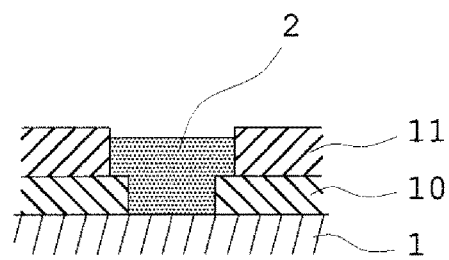
Figure 2C:
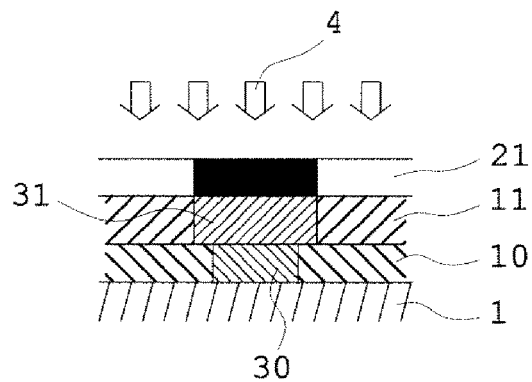

Then, as shown in FIG. 2C, by conducting an exposure using the light source 4 (mixed-line mercury lamp) upon a mask 21 carrying a particular pattern different from that of the mask 20 being overlaid on the resist layers 10 and 11 on the front-surface side, the resist layer 11 was affected and hardened in accordance with the pattern of the mask 21 for exposure. In that situation, since the mask 21 allowed a smaller area to be exposed, an unexposed portion 30 in the earlier-exposed resist layer 10 was not hardened. The exposure dose on that occasion was 70 mJ/cm² as measured by the detector for 365 nm wavelength.

Then, as shown in FIG. 2D, on the front-surface side, by a development, the upper resist layer 11 was formed, in accordance with a particular pattern, into a part 11 of a resist mask with an aperture 41 arranged at the unexposed portion 31 as well as the lower resist layer 10 was formed in the similar manner into a part 10 of the resist mask with an aperture 40 arranged at the unexposed portion 30, to uncover the substrate 1. In the process of development, 1% solution of sodium carbonate at 30° C. temperature was applied under the spray pressure of 0.08 MPa for approximately 80 seconds. The aperture 40 and the aperture 41 were merged into an aperture having a substantially T-shaped section.

Then, as shown in FIG. 2E, after the treatment for surface activation by removal of surface oxide film and by other common pre-plating treatment, nickel plating was made in the aperture 40, 41 through which the substrate 1 was shown, to form a coat layer (metal layer, electrode layer) 2 of 45 μm thickness.

After that, the resist masks 10, 11 formed on both sides of the substrate 1 were entirely stripped away with alkaline solution, to obtain a substrate for semiconductor element mount provided with a coat layer (metal layer, electrode layer) 2 having a substantially T-shaped section.

Use of an ultraviolet LED lamp of a particular wavelength, instead of the mercury lamp, as a light source, would allow a desired resist layer to be affected by exposure without a bandpass filter.

Since the resist layer formed on the back-surface side should be hardened over the entire surface, there is no problem to use any type of dry film resist. In addition, the cover layer 2 to be formed may be constructed of a plurality of layers overlaid one on another; cover layers made of gold, palladium, nickel, copper, cobalt, and alloys of these metals can be selected in accordance with requirement, to be sequentially deposited.

Example 2

Here, in reference to FIG. 3, an explanation is made of an experiment conducted by the present inventor as the embodiment example 2 in which three-layered dry film resist is used. As shown in FIG. 3A, on both surfaces of a Cu plate of 0.15 mm thickness as a substrate 1, dry film resist (Asahi Kasei E-Materials: ADH-252) of 25 μm thickness was laminated, to forma resist layer 10 (the back-surface side not shown). The lamination conditions on that occasion were: roll temperature 105° C.; roll pressure 0.5 MPa; and feeding speed 2.5 m/min. The laminated dry film resist is a negative type resist, and can be exposed and affected by h-line irradiation (peak wavelength in spectral photosensitivity: 405 nm).

Then, overlaid on the resist layer 10 on one side (front-surface side), dry film resist different from the resist layer 10 in main peak wavelength in spectral photosensitivity (Asahi Kasei E-Materials: AQ-2558) of 25 μm thickness was laminated under the same lamination conditions as above, to form a second resist layer 11. This dry film resist also is a negative-type resist, and can be exposed and affected by i-line irradiation (peak wavelength in spectral photosensitivity: 365 nm).

Then, overlaid on the resist layers 10 and 11 on one side (front-surface side), the dry film resist same as the resist layer 10 (Asahi Kasei E-Materials: ADH-252) was laminated under the same lamination conditions as above, to form an uppermost resist layer 12.

Figure 3A:
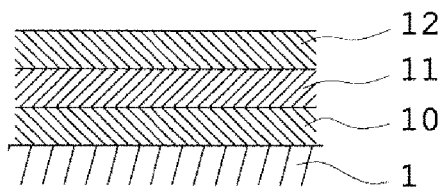
FIGS. 3A-3E show, in the form of sectional views, what is done in individual processes along the production flow of the production method in a case where the resist layers are composed of three layers as in the second embodiment example.

In this way, on the front-surface side of the substrate 1, the resist layers 10, 11, and 12 were sequentially formed of the two kinds of dry film resist different in main peak wavelength in spectral photosensitivity as shown in FIG. 3A, while on the back-surface side (not shown) was formed a resist layer same as the lowermost resist layer on the front-surface side.

Figure 3D:
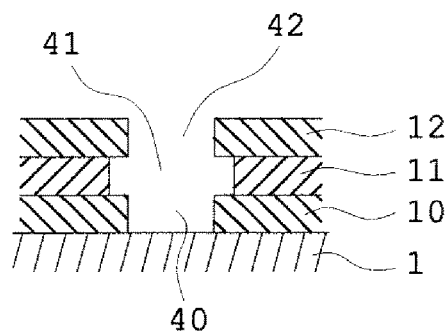
Figure 3B:
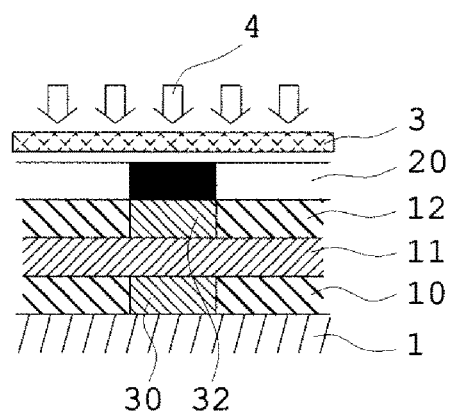

Then, as shown in FIG. 3B, a mask 20 for exposure carrying a particular pattern was overlaid on the front-surface side resist layers 10, 11 and 12, and a bandpass filter 3 for 405 nm was set between the mask 20 and a light source 4 for exposure.

Then, an exposure was conducted using, as the light source 4, a mercury lamp (Oak Manufacturing: short arc lamp) providing mixed lines in which i-line is the main peak wavelength and h line and g line are contained, to make ultraviolet light of 405 nm wavelength affect and harden the uppermost resist layer 12 and the lowermost resist layer 10 on the front-surface side in accordance with the pattern carried by the mask 20, while the same light source directly affected and hardened the resist layer 10 on the back-surface side over the entire surface (back-surface side not shown). On that occasion, the exposure dose was 30 mJ/cm² on the front-surface side as measured by a detector for 405 nm wavelength and was 80 mJ/cm² on the back-surface side as measured by a detector for 365 nm wavelength.

This means that an h-line exposure was conducted through the bandpass filter 3 for 405 nm wavelength on the front-surface side, leaving the middle resist layer 11 sandwiched between the uppermost layer and the lowermost layer intact, while a mixed-line exposure on the back-surface side altered the resist layer into a resist mask hardened over the entire surface.

Figure 3E:
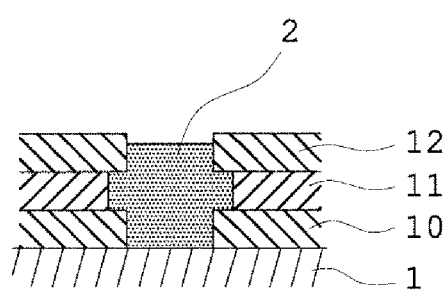
Figure 3C:
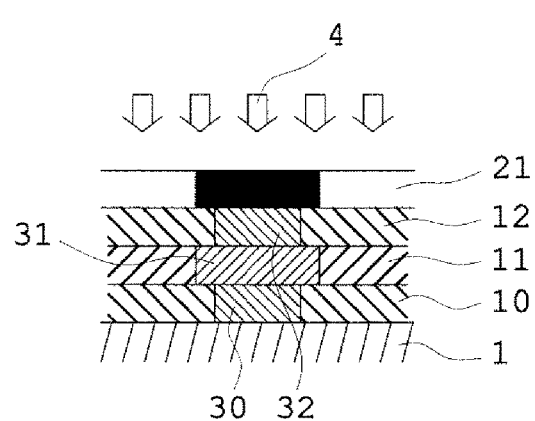

Then, as shown in FIG. 3C, by conducting an exposure using the light source 4 (mixed-line mercury lamp) upon a mask 21 carrying a particular pattern different from that of the mask 20 being overlaid on the resist layers 10, 11 and 12 on the front-surface side, the resist layer 11 was affected and hardened in accordance with the pattern of the mask 21 for exposure. In that situation, since the mask 21, which was used in the later-conducted exposure, allowed a smaller area to be exposed than the mask 20, an unexposed portion 30 in the earlier-exposed resist layer 10 and an unexposed portion 32 in the earlier-exposed resist layer 12 were not hardened. The exposure dose on that occasion was 70 mJ/cm² as measured by the detector for 365 nm wavelength.

Then, as shown in FIG. 3D, on the front-surface side, by a development, the uppermost resist layer 12 and the lowermost resist layer 10 were formed, in accordance with a particular pattern, into a part 12 of a resist mask with an aperture 42 arranged at the unexposed portion 32 and a part 10 of the resist mask with an aperture 40 arranged at the unexposed portion 30. Furthermore, the middle resist layer 11 sandwiched between the uppermost layer 12 and the lowermost resist layer 10 also was formed into a part 11 of the resist mask with an aperture 41 arranged at the unexposed portion 31, to uncover the substrate 1. In the process of development, 1% solution of sodium carbonate at 30° C. temperature was applied under the spray pressure of 0.08 MPa for approximately 120 seconds. The aperture 40, the aperture 41 and the aperture 42 were merged into an aperture with a section shaped to have concavities on both sides.

Then, as shown in FIG. 3E, after the treatment for surface activation by removal of surface oxide film and by other common pre-plating treatment, nickel plating was made in the aperture 40, 41, 42 through which the substrate 1 appeared as uncovered, to form a coat layer (metal layer, electrode layer) 2 of 74 μm thickness.

After that, the resist masks 10, 11, 12 formed on both sides of the substrate 1 were entirely stripped away with alkaline solution, to obtain a substrate for semiconductor element mount provided with a coat layer (metal layer, electrode layer) 2 having a section shaped to have convexities on both sides.

Use of an ultraviolet LED lamp of a particular wavelength, instead of the mercury lamp, as a light source, would allow a desired resist layer to be affected by exposure without a bandpass filter.

Since the resist layer formed on the back-surface side should be hardened over the entire surface, there is no problem to use any type of dry film resist. In addition, the cover layer 2 to be formed may be constructed of a plurality of layers overlaid one on another; cover layers made of gold, palladium, nickel, copper, cobalt, and alloys of these metals can be selected in accordance with requirement, to be sequentially deposited.

Example 3

In reference to FIG. 4, an explanation is made of another experiment conducted by the present inventor as the embodiment example 3 in which also three-layered dry film resist is used. As shown in FIG. 4A, on both surfaces of a Cu plate of 0.15 mm thickness as a substrate 1, dry film resist (Asahi Kasei E-Materials: AQ-2558) of 25 μm thickness was laminated, to form a resist layer 10 (the back-surface side not shown). The lamination conditions on that occasion were: roll temperature 105° C.; roll pressure 0.5 MPa; and feeding speed 2.5 m/min. The laminated dry film resist is a negative type resist, and can be exposed and affected by i-line irradiation (peak wavelength in spectral photosensitivity: 365 nm).

Then, overlaid on the resist layer 10 on one side (front-surface side), dry film resist different from the resist layer 10 in main peak wavelength in spectral photosensitivity (Asahi Kasei E-Materials: ADH-252) of 25 μm thickness was laminated under the same lamination conditions as above, to form an upper resist layer 11. This dry film resist also is a negative-type resist, and can be exposed and affected by h-line irradiation (peak wavelength in spectral photosensitivity: 405 nm).

Then, overlaid on the resist layers 10 and 11 on one side (front-surface side), the dry film resist same as the resist layer 10 (Asahi Kasei E-Materials: AQ-2558) was laminated under the same lamination conditions as above, to form an uppermost resist layer 12.

Figure 4A:
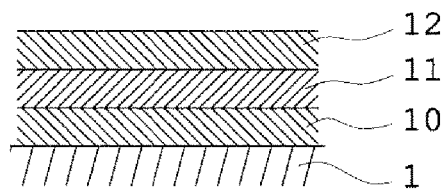
FIGS. 4A-4E show, in the form of sectional views, what is done in individual processes along the production flow of the production method in a case where the resist layers are composed of three layers as in the third embodiment example.

In this way, on the front-surface side of the substrate 1, the resist layers 10, 11, and 12 were sequentially formed of the two kinds of dry film resist different in main peak wavelength in spectral photosensitivity as shown in FIG. 4A, while on the back-surface side (not shown) was formed a resist layer same as the lowermost resist layer on the front-surface side.

Figure 4D:
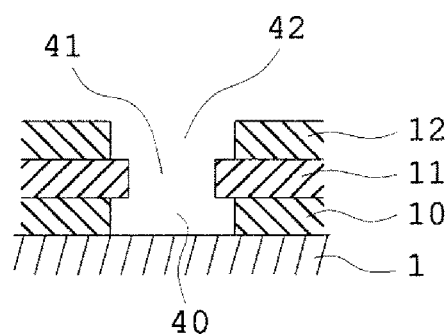
Figure 4B:
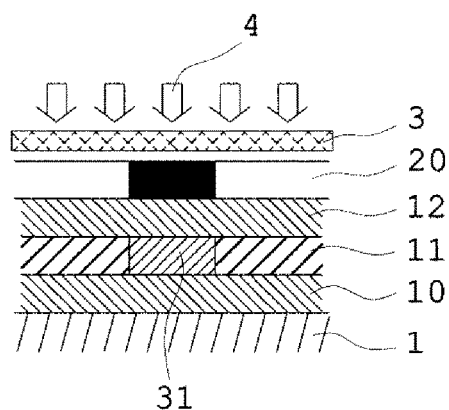

Then, as shown in FIG. 4B, a mask 20 for exposure carrying a particular pattern was overlaid on the front-surface side resist layers 10, 11 and 12, and a bandpass filter 3 for 405 nm was set between the mask 20 and a light source 4 for exposure.

Then, an exposure was conducted using, as the light source 4, a mercury lamp (Oak Manufacturing: short arc lamp) providing mixed lines in which i-line is the main peak wavelength and h line and g line are contained, to make ultraviolet light of 405 nm wavelength affect and harden the middle resist layer 11 on the front-surface side in accordance with the pattern carried by the mask 20, while the same light source directly affected and hardened the resist layer 10 on the back-surface side over the entire surface (back-surface side not shown). On that occasion, the exposure dose was 16 mJ/cm$^2$ on the front-surface side as measured by a detector for 405 nm wavelength and was 80 mJ/cm$^2$ on the back-surface side as measured by a detector for 365 nm wavelength.

This means that an h-line exposure was conducted through the bandpass filter 3 for 405 nm wavelength on the front-surface side, leaving the uppermost resist layer 10 and the lowermost resist layer 12 intact, while a mixed-line exposure on the back-surface side altered the resist layer into a resist mask hardened over the entire surface.

Figure 4E:
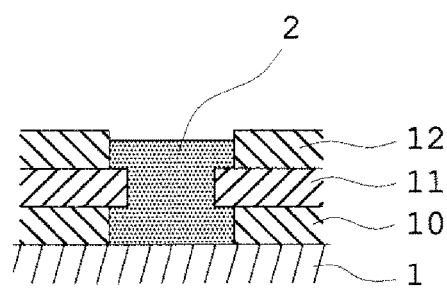
Figure 4C:
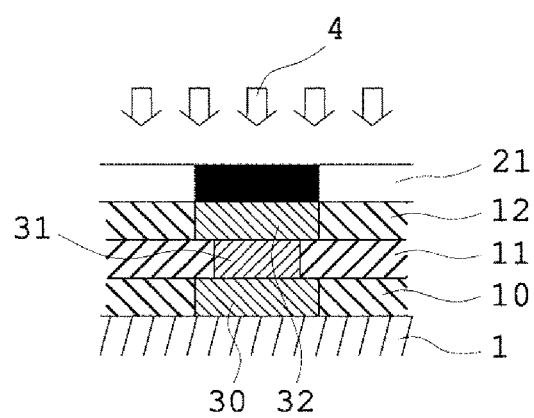

Then, as shown in FIG. 4C, by an exposure using the light source 4 (mixed-line mercury lamp) upon a mask 21 carrying a particular pattern different from that of the mask 20 being overlaid on the resist layers 10, 11 and 12 on the front-surface side, the uppermost resist layer 12 and the lowermost resist layer 10 were affected and hardened in accordance with the pattern of the mask 21 for exposure. In that situation, since the mask 21, which was used in the later-conducted exposure, allowed a smaller area to be exposed and hardened than the mask 20, an unexposed portion 31 in the earlier-exposed resist layer 11 was not hardened. The exposure dose on that occasion was 100 mJ/cm$^2$ as measured by the detector for 365 nm wavelength.

Then, as shown in FIG. 4D, on the front-surface side, by a development, the uppermost resist layer 12 and the lowermost resist layer 10 were formed, in accordance with a particular pattern, into a part 12 of a resist mask with an aperture 42 arranged at the unexposed portion 32 and a part 10 of the resist mask with an aperture 40 arranged at the unexposed portion 30. Furthermore, the middle resist layer 11 sandwiched between the uppermost layer and the lowermost layer also was formed into a part 11 of the resist mask with an aperture 41 arranged at the unexposed portion 31, to uncover the substrate 1. In the process of development, 1% solution of sodium carbonate at 30° C. temperature was applied under the spray pressure of 0.08 MPa for approximately 120 seconds. The aperture 40, the aperture 41 and the aperture 42 were merged into an aperture with a section shaped to have concavities on both sides.

Then, as shown in FIG. 4E, after the treatment for surface activation by removal of surface oxide film and by other common pre-plating treatment, nickel plating was made in the aperture 40, 41, 42 through which the substrate 1 was shown, to form a coat layer (metal layer, electrode layer) 2 of 71 μm thickness.

After that, the resist masks 10, 11, 12 formed on both sides of the substrate 1 were entirely stripped away with alkaline solution, to obtain a substrate for semiconductor element mount provided with a coat layer (metal layer, electrode layer) 2 having a section shaped to have concavities on both sides.

Use of an ultraviolet LED lamp of a particular wavelength, instead of the mercury lamp, as a light source, would allow a desired resist layer to be affected by exposure without a bandpass filter.

Since the resist layer formed on the back-surface side should be hardened over the entire surface, there is no problem to use any type of dry film resist. In addition, the cover layer 2 to be formed may be constructed of a plurality of layers overlaid one on another; cover layers made of gold, palladium, nickel, copper, cobalt, and alloys of these metals can be selected in accordance with requirement, to be sequentially deposited.

The invention claimed is:

1. A method for producing a substrate for semiconductor element mounting that is provided, on an electroconductive substrate, with a coat layer by plating to be formed into terminals, the method sequentially comprising the steps of:

forming, on a surface of the substrate, a layered structure of a plurality of resist layers including at least one resist layer made of first dry film resist and at least one resist layer made of second dry film resist laminated on each other, the first dry film resist and the second dry film resist being negative resist and being different in main peak wavelength in spectral photosensitivity from each other;

a first exposure process of irradiating the layered structure of the plurality of resist layers, via a first exposure mask overlaid on a top surface of the layered structure of the plurality of resist layers, with ultraviolet light with a predetermined wavelength to which the second dry film resist is substantially transparent and unaffected, through a band pass filter, to thereby harden, out of the plurality of resist layers, the at least one resist layer made of the first dry film resist in accordance with a first pattern carried by the first exposure mask overlaid on the top surface of the layered structure of the plurality of resist layers;

a second exposure process of irradiating the layered structure of the plurality of resist layers, via a second exposure mask overlaid on the top surface of the layered structure of the plurality or resist layers, with light containing at least a wavelength component to which at least the second dry film resist has photosensitivity, to thereby harden, out of the plurality of resist layers, the at least one resist layer made of the second dry film resist in accordance with a second pattern carried by the second exposure mask overlaid on the top surface of the layered structure of the plurality of resist layers;

a development process of partially uncovering the surface of the substrate by removing non-hardened portions of the plurality of resist layers, to form a resist mask having an aperture;

a process of forming a coat layer by plating a portion of the substrate where the surface thereof is uncovered; and removing the resist mask;

wherein the first pattern carried by the first exposure mask and the second pattern carried by the second exposure mask are different, and the second exposure mask allows a smaller area in the top surface of the layered structure of the plurality of resist layers to be exposed than the first exposure mask so that a non-hardened portion of the resist layer made of the first dry film resist after the first exposure process is left non-hardened through the second exposure process.

2. The method for producing a substrate for semiconductor element mounting according to claim 1,
wherein the process of forming, on the surface of the substrate, the layered structure of the plurality of resist layers includes a process of forming a two-layered structure by forming a lower resist layer out of the first dry film resist and forming an upper resist layer out of the second dry film resist, and
wherein the lower resist layer is hardened in the first exposure process and the upper resist layer is hardened in the second exposure process, to shape the section of the aperture in the resist mask for plating, through which the surface of the substrate appears as uncovered, into a letter T.

3. The method for producing a substrate for semiconductor element mounting according to claim 1,
wherein the process of forming, on the surface of the substrate, the layered structure of the plurality of resist layers includes a process of forming a three-layered structure by forming a lower resist layer out of the first dry film resist, forming a middle resist layer out of the second dry film resist, and forming an upper resist layer out of the first dry film resist, and
wherein the lower resist layer and the upper resist layer are hardened in the second exposure process, to shape the section of the aperture in the resist mask for plating, through which the surface of the substrate appears as uncovered, with convexities on both sides.

4. The method for producing a substrate for semiconductor element mounting according to claim 1,
wherein the process of forming, on the surface of the substrate, the layered structure of the plurality of resist layers includes a process of forming a three-layered structure by forming a lower resist layer out of the second dry film resist, forming a middle resist layer out of the first dry film resist, and forming an upper resist layer out of the second dry film resist, and
wherein the middle resist layer is hardened in the second exposure process, to shape the section of the aperture in the resist mask for plating, through which the surface of the substrate appears as uncovered, with concavities on both sides.

5. A method for producing a substrate for semiconductor element mounting that is provided, on an electroconductive substrate, with a coat layer by plating to be formed into terminals, the method sequentially comprising the steps of:
forming, on a surface of the substrate, a layered structure of a plurality of resist layers including at least one resist layer made of first dry film resist and at least one resist layer made of second dry film resist laminated on each other, the first dry film resist and the second dry film resist being negative resist and being different in main peak wavelength in spectral photosensitivity from each other;
a first exposure process of irradiating the layered structure of the plurality of resist layers, via a first exposure mask overlaid on a top surface of the layered structure of the plurality of resist layers, with light containing at least a wavelength component to which at least the first dry film resist has photosensitivity, to thereby harden, out of the plurality of resist layers, the at least one resist layer made of the first dry film resist in accordance with a first pattern carried by the first exposure mask overlaid on the top surface of the layered structure of the plurality of resist layers;
a second exposure process of irradiating the layered structure of the plurality of resist layers, via a second exposure mask overlaid on the top surface of the layered structure of the plurality of resist layers, with ultraviolet light with a predetermined wavelength to which the first dry film resist is substantially transparent and unaffected, through a band pass filter, to thereby harden, out of the plurality of resist layers, the at least one resist layer made of the second dry film resist in accordance with a second pattern carried by the second exposure mask overlaid on the top surface of the layered structure of the plurality of resist layers;
a development process of partially uncovering the surface of the substrate by removing non-hardened portions of the plurality of resist layers, to form a resist mask having an aperture;
a process of forming a coat layer by plating a portion of the substrate where the surface thereof is uncovered; and
removing the resist mask;
wherein the first pattern carried by the first exposure mask and the second pattern carried by the second exposure mask are different, and the second exposure mask allows a larger area in the top surface of the layered structure of the plurality of resist layers to be exposed than the first exposure mask.

* * * * *